(12) United States Patent
Hayashi

(10) Patent No.: US 9,721,900 B2
(45) Date of Patent: Aug. 1, 2017

(54) SEMICONDUCTOR PACKAGE AND ITS MANUFACTURING METHOD

(71) Applicant: J-Devices Corporation, Usuki, Oita (JP)

(72) Inventor: Naoki Hayashi, Yokohama (JP)

(73) Assignee: J-Devices Corporation, Usuki (JP)

( * ) Notice: Subject to any disclaimer, the term of this patent is extended or adjusted under 35 U.S.C. 154(b) by 0 days.

(21) Appl. No.: 15/364,851

(22) Filed: Nov. 30, 2016

(65) Prior Publication Data

US 2017/0170123 A1 Jun. 15, 2017

(30) Foreign Application Priority Data

Dec. 11, 2015 (JP) ................. 2015-241986

(51) Int. Cl.
*H01L 23/28* (2006.01)
*H01L 21/48* (2006.01)
(Continued)

(52) U.S. Cl.
CPC ...... *H01L 23/5389* (2013.01); *H01L 21/6835* (2013.01); *H01L 21/76877* (2013.01); *H01L 21/76895* (2013.01); *H01L 23/5384* (2013.01); *H01L 23/5386* (2013.01); *H01L 24/06* (2013.01); *H01L 24/19* (2013.01); *H01L 24/20* (2013.01); *H01L 2221/68359* (2013.01); *H01L 2221/68386* (2013.01); *H01L 2224/05147* (2013.01); *H01L 2224/06181* (2013.01); *H01L 2224/215* (2013.01); *H01L 2924/01029* (2013.01)

(58) Field of Classification Search
CPC ..... H01L 2224/215; H01L 2224/73265; H01L 23/49827; H01L 24/06; H01L 2924/01029; H01L 23/5389; H01L 23/481; H01L 2224/05099; H01L 23/5384; H01L 23/5386; H01L 21/6835
See application file for complete search history.

(56) References Cited

U.S. PATENT DOCUMENTS 6,720,647 B2  4/2004  Fukuizumi
9,034,694 B1 * 5/2015  Kalandar ............... H01L 24/19
                                                    438/108

(Continued)

FOREIGN PATENT DOCUMENTS

JP   H09-74193 A     3/1997
JP   2001-352009 A   12/2001
WO   2012-164817 A1  12/2012

*Primary Examiner* — Jasmine Clark
(74) *Attorney, Agent, or Firm* — TYPHA IP LLC

(57) ABSTRACT

Provided is a bonding method to construct a bonding with high thermal reliability between electrodes formed on both chip surfaces of a semiconductor device and wiring. The bonding method includes: bonding a semiconductor chip over a first substrate with a bonding film interposed therebetween; forming a first insulating film over the semiconductor chip; forming a first via in the first insulating film; forming a first wiring over the first insulating film so as to be electrically connected to the semiconductor chip through the first via; forming a second via in the bonding film; and forming a second wiring under the semiconductor chip so as to be electrically connected to the semiconductor chip through the second via.

18 Claims, 8 Drawing Sheets

(51) Int. Cl.
*H01L 23/538* (2006.01)
*H01L 23/00* (2006.01)
*H01L 21/768* (2006.01)
*H01L 21/683* (2006.01)

(56) References Cited

U.S. PATENT DOCUMENTS

| | | | |
|---|---|---|---|
| 2013/0334682 A1* | 12/2013 | Kim | H01L 23/295 |
| | | | 257/737 |
| 2014/0110723 A1 | 4/2014 | Ikegami et al. | |
| 2014/0110841 A1* | 4/2014 | Beer | H01L 23/49822 |
| | | | 257/738 |
| 2015/0259194 A1* | 9/2015 | Lin | B81B 7/007 |
| | | | 257/773 |

* cited by examiner

SEMICONDUCTOR PACKAGE AND ITS MANUFACTURING METHOD

CROSS REFERENCE TO RELATED APPLICATIONS

This application is based on and claims the benefit of priority from the prior Japanese Patent Application No. 2015-241986, filed on Dec. 11, 2015, the entire contents of which are incorporated herein by reference.

FIELD

The present invention relates to a semiconductor package exemplified by a semiconductor package mounted with a power semiconductor device and a manufacturing method thereof.

BACKGROUND

A power semiconductor device is a semiconductor device having a basic function of converting and controlling electric power. A power semiconductor device plays an important role not only in an application to an inverter and a small-sized motor employed in consumer electronics and electronic office equipment but also in management of conversion and control of electric power of an electronic power system in a power plant and a motor-driving system in a train, a vehicle, and so on. As a typical power semiconductor device, a rectifier diode having a pn-junction diode structure or a Schottky-barrier diode structure, a power transistor, a transistor such as a metal-oxide semiconductor field-effect transistor (MOSFET), a thyristor, and the like are represented. As disclosed in Re-publication of PCT International Publication No. WO2012/164817 and Japanese Patent Application Publications No. H09-74193, and 2001-352009, a power semiconductor device is generally supplied as a semiconductor chip (hereinafter, also referred to as a chip) having one or more of electrodes (terminals) over and under the semiconductor chip. Wiring is constructed on both top and bottom surfaces of the chip, and the chip is electrically connected to an external power source or another device through the wiring.

SUMMARY

An embodiment of the present invention is a semiconductor package including: a semiconductor chip; a first insulating film embedding the semiconductor chip and having a first via; a first wiring located over the semiconductor chip and electrically connected to the semiconductor chip through the first via; a bonding film located under the semiconductor chip and having a second via; and a second wiring located under the bonding film and electrically connected to the semiconductor chip through the second via, where a material included in the first insulating film is different from a material included in the bonding film.

The semiconductor chip may have a first terminal and a second terminal under and over the semiconductor chip, respectively, and the semiconductor chip may be electrically connected to the second wiring and the first wiring through the first terminal and the second terminal, respectively.

The semiconductor package may further possess a third via in the first insulating film and have a third wiring located under the first insulating film and electrically connected to the first wiring through the third via. The second wiring and the third wiring may exist in the same layer.

The first via, the second via, and the third via may be different in size from one another. The bonding film may further include a plurality of vias.

The bonding film may include an insulating material.

The semiconductor package may further include a substrate over the first wiring.

An embodiment of the present invention is a manufacturing method of a semiconductor package. The manufacturing method includes: bonding a semiconductor chip over a first substrate with a bonding film interposed therebetween; forming a first insulating film over the semiconductor chip; forming a first via in the first insulating film; forming a first wiring over the first insulating film so as to be electrically connected to the semiconductor chip through the first via; forming a second via in the bonding film; and forming a second wiring under the semiconductor chip so as to be electrically connected to the semiconductor chip through the second via.

In the manufacturing method, the semiconductor chip may include a first terminal and a second terminal under and over the semiconductor chip, respectively, and the first wiring and the second wiring may be formed so as to be electrically connected to the semiconductor chip through the second terminal and the first terminal, respectively.

In the manufacturing method, a third via may be formed in the first insulating film simultaneously with the first via, and the first wiring may be formed so as to fill the third via. A third wiring may be formed under the third via simultaneously with the second wiring so that the third wiring is electrically connected to the first wiring.

In the manufacturing method, the first via, the second via, and the third via may be different in size from one another. The second via may be formed so as to pass through the first substrate. The second via may be formed so that the bonding film has a plurality of vias.

In the manufacturing method, the bonding film may include an insulating material. A material included in the first insulating film may be different from a material included in the bonding film.

In the manufacturing method, the first substrate may have an opening portion and a wiring passing through the opening portion, and the first wiring may be formed so as to be electrically connected to the wiring through the third via.

DESCRIPTION OF EMBODIMENTS

Figure 1A:
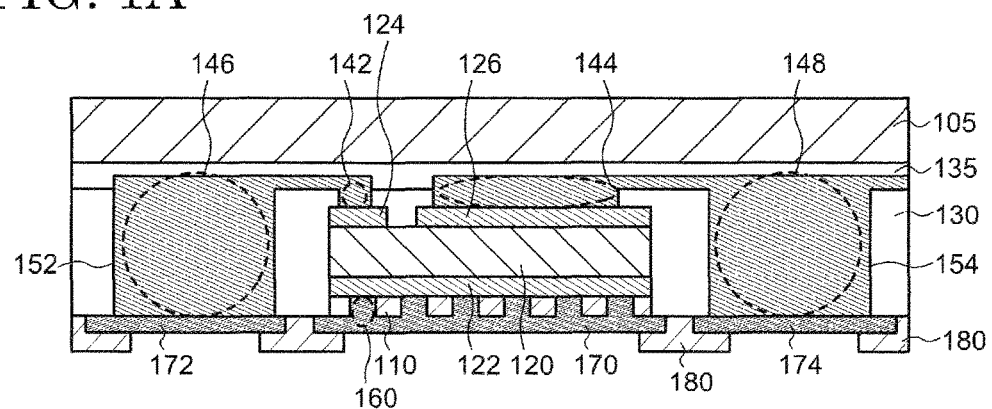
FIG. 1A to FIG. 1C are each a schematic cross-sectional view of a semiconductor package of an embodiment of the present invention.

Hereinafter, the embodiments of the present invention are explained with reference to the drawings. Note that the present invention can be implemented in a variety of modes within the concept of the invention, and the interpretation should not be limited by the disclosure in the embodiments represented below.

In the drawings, the width, thickness, shape, and the like of each component may be schematically illustrated and different from those of an actual mode in order to provide a clearer explanation. However, the drawings simply give an example and do not limit the interpretation of the present invention. In the specification and each of the drawings, elements which are the same as those explained in the preceding drawings are denoted with the same reference numbers, and their detailed explanation may be omitted appropriately.

In the present invention, when a plurality of films is formed by processing one film, the plurality of films may have functions or roles different from each other. However, the plurality of films originates from a film which is formed as the same layer in the same process. Therefore, the plurality of films is defined as films existing in the same layer.

It is properly understood that another effect different from that provided by the modes of the embodiments described below is achieved by the present invention if the effect is obvious from the description in the specification or readily conceived by the persons ordinarily skilled in the art.

First Embodiment

In the present embodiment, a structure of a semiconductor package according to an embodiment of the present invention is explained using FIG. 1A.

The semiconductor package includes a semiconductor chip 120. A terminal (extraction electrode) is formed on at least one of both chip surfaces. In FIG. 1A, an example is illustrated where the semiconductor chip 120 has a first terminal 122 and two second terminals 124 and 126.

The semiconductor package has a first insulating film 130 over the semiconductor chip 120 so as to embed the semiconductor chip 120 and the second terminals 124 and 126. The first insulating film 130 has a function to protect the semiconductor chip 120 and provide physical strength to the semiconductor package, by which handling of the semiconductor package is facilitated.

The first insulating film 130 possesses vias (opening portions). Specifically, the first insulating film 130 has first vias 142 and 144 over a region overlapping with the second terminals 124 and 126. Moreover, the first insulating film 130 has third vias 146 and 148 in a region which is close to the semiconductor chip 120 but does not overlap with the semiconductor chip 120. The first vias 142 and 144 reach the second terminals 124 and 126, respectively, and the third vias 146 and 148 pass through the first insulating film 130.

The semiconductor package has first wiring 152 and 154 over the first insulating film 130. The first wiring 152 is provided so as to fill the first via 142 and the third via 146, while the first wiring 154 is provided so as to fill the first via 144 and the third via 148. A part of the first wiring 152 and a part of the first wiring 154 are in contact with a top surface of the first insulating film 130. The first wiring 152 and 154 are electrically connected to the semiconductor chip 120 through the second terminals 124 and 126, respectively. As described below, the first wiring 152 and 154 can be formed with an electroplating method, a paste of a conductive metal (hereinafter, referred to as a metal paste), and the like.

The semiconductor package shown in FIG. 1A may further include a substrate (second electrode) 105 over the first wiring 152 and 154 with a second insulating film 135 interposed therebetween. The second insulating film 135 has a function to adhere the second substrate 105 to the first wiring 152 and 154. The second substrate 105 has a function to provide physical strength to the semiconductor package in addition to a function to protect the semiconductor chip 120. Furthermore, as described below, the second substrate 105 functions as a supporting substrate when a second wiring 170 and third wiring 172 and 174 are formed. Hence, the semiconductor package according to the present embodiment does not necessarily require the second insulating film 135 and the second substrate 105, and these elements may not be disposed in view of physical strength and facility in handling of the semiconductor package.

The semiconductor package further possesses a bonding film 110 under the semiconductor chip 120, and the bonding film 110 has at least one second via 160. Additionally, the second wiring 170 is formed under the semiconductor chip 120 and the bonding film 110 so as to fill the second via 160. The second wiring 170 is electrically connected to the semiconductor chip 120 through the first terminal 122. As described below, the first wiring 152 and 154 can be formed with an electroplating method, a metal paste, and the like.

A material of the bonding film 110 may be different from that of the first insulating film 130. That is, the materials included in the bonding film 110 and the first insulating film 130 may be different from each other. Therefore, the material surrounding the first vias 142 and 144 may be different from the material surrounding the second via 160.

The semiconductor package further has the third wiring 172 and 174 under the third vias 146 and 148. The first vias 142 and 144, the second via 160, and the third vias 146 and 148 may be different in size (cross-sectional area) from one another. For example, the third vias 146 and 148 may be the largest, and the second via 160 may be the smallest. Alternatively, the first vias 142 and 144 may be the smallest.

The third wiring 172 is electrically connected to the first wiring 152, and the third wiring 174 is electrically connected to the first wiring 154. Note that the second wiring 170 and the third wirings 172 and 174 are not physically connected to one another and are separated from one another. However, they can exist in the same layer. As described below, the second wiring 170 and the third wirings 172 and 174 can be formed with an electroplating method, a metal paste, and the like.

The semiconductor package may further contain a resist layer 180 under the second wiring 170 and the third wirings 172 and 174. The resist layer 180 has a function to protect edge portions of the second wiring 170 and the third wirings 172 and 174 and may be low in affinity to solder so that solder selectively contacts with the second wiring 170 and the third wirings 172 and 174, for example.

The semiconductor package according to the present embodiment allows the construction of wiring on terminals formed on both chip surfaces, and the use of the wiring enables it to supply electrical signals to the terminals provided on the both chip sides from one of the chip sides. Additionally, the same formation method of wiring (e.g., electroplating method) can be applied to both chip surfaces.

Generally, when a chip having terminals on both surfaces is mounted, wiring is formed over the terminal on the top chip surface with an electroplating method. On the other hand, the terminal on the bottom chip surface is bonded to a wiring pad arranged on a printed circuit board and the like by using solder with a high melting point, a sintered metal (e.g., sintered silver), a conductive film such as a conductive die-attach film (DAF), or a bonding (metal-diffusion bonding) induced by diffusion of metals in contact with each other. That is, the formation methods of the wiring are different between the top chip surface and the bottom chip surface. Hence, an apparatus such as a chip-bonding apparatus, which is not utilized when the wiring is formed on the terminal on the upper surface, is required, which results in complication of the process and an increase in manufacturing cost. Moreover, the bonding conducted with solder having a high-melting point, a sintered metal, and a conductive film and a metal-diffusion bonding have relatively low thermal reliability and readily cause peeling at a bonding interface and generation of voids at and near the bonding interface.

On the contrary, as described below, in the semiconductor package which is an embodiment of the present invention, wiring can be formed over terminals on both chip surfaces with the same manufacturing apparatus in the same process because the wiring can be constructed on the terminals of both chip surfaces by using the same method. Hence, the manufacturing process can be simplified and the manufacturing cost can be reduced. Moreover, since the wiring can be formed with the material (e.g., copper) which is the same as that of the terminals on the both chip surfaces, bonding with high thermal reliability can be realized.

Second Embodiment

Figure 1B:
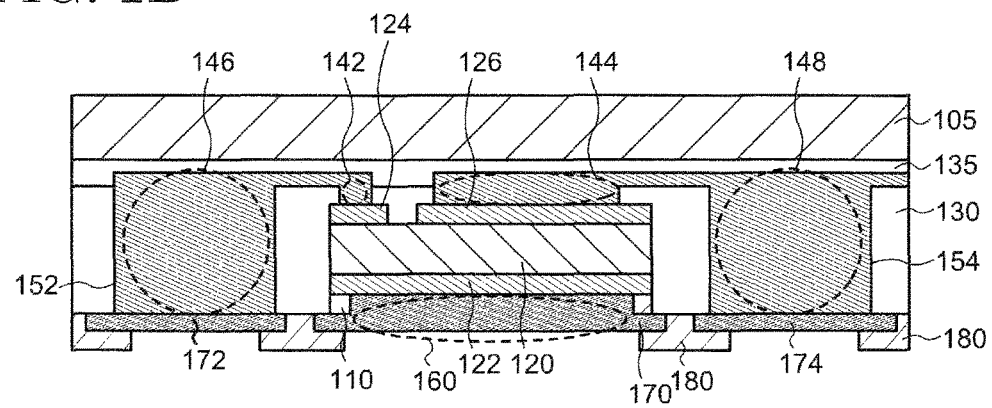

In the present embodiment, a structure of a semiconductor package according to an embodiment of the present invention is explained using FIG. 1B. The semiconductor package of the present embodiment is different from that of First Embodiment in structure of the second via 160. Description of the structures which are the same as those of First Embodiment is omitted.

As shown in FIG. 1B, in the semiconductor package of the present embodiment, a single number of via (second via 160) is formed in the bonding film 110, and the second wiring 170 is formed so as to fill the via 160. The use of this structure allows the expansion of the connection region between the first terminal 122 with the second wiring 170, resulting in a large decrease in contact resistance. Additionally, the heat radiation from the chip can be promoted.

Third Embodiment

Figure 1C:
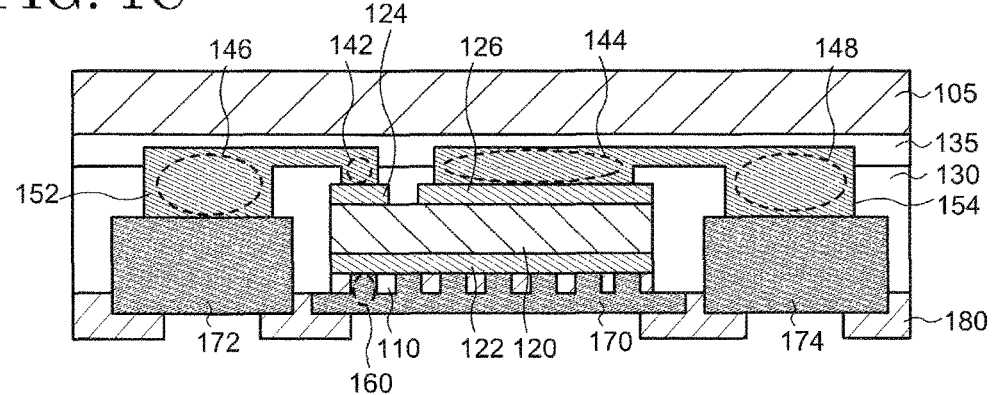

In the present embodiment, a structure of a semiconductor package according to an embodiment of the present invention is explained using FIG. 1C. The semiconductor package of the present embodiment is different from those of First and Second Embodiments in structure of the third vias 146 and 148. Description of the structures which are the same as those of First and Second Embodiments is omitted.

As shown in FIG. 1C, in the semiconductor package of the present embodiment, the third vias 146 and 148 each have a plurality of diameters. That is, the third vias 146 and 148 each have two or more regions which are different in opening area. Therefore, the first wirings 152 and 154 are connected to the third wirings 172 and 174 in the third vias 146 and 148, respectively. The third vias 146 and 148 having such a configuration can be formed by, for example, forming opening portions from the top surface of the first insulating film 130 so as not to pass through the first insulating film 130, followed by forming larger opening portions from the bottom surface of the first insulating film 130. The use of this structure allows each via to be filled by an electroplating method and remarkably reduces smears generated in the vias when the vias are formed.

Fourth Embodiment

Figure 2:
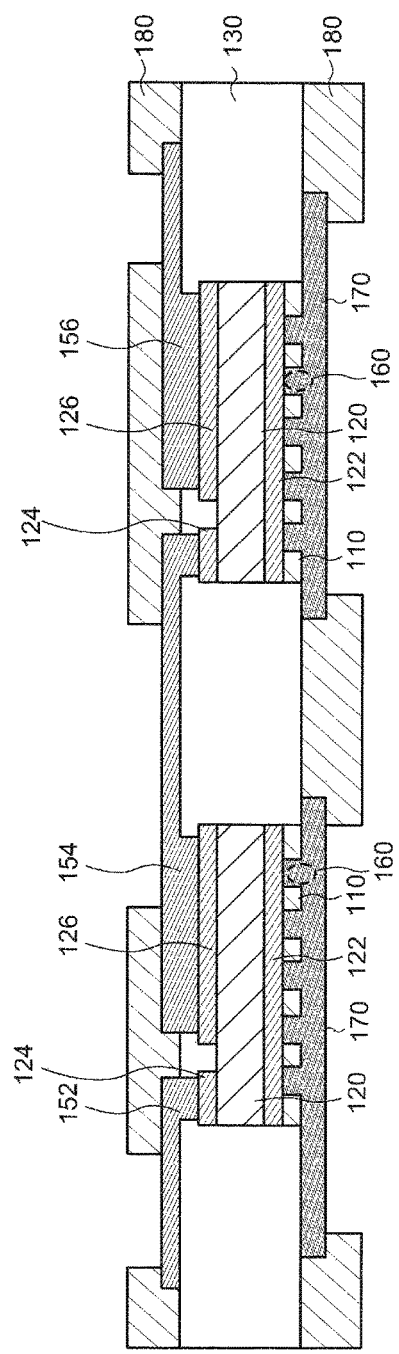
FIG. 2 is a schematic cross-sectional view of a semiconductor package of an embodiment of the present invention.

In the present embodiment, a structure of a semiconductor package according to an embodiment of the present invention is explained using FIG. 2. The semiconductor package of the present embodiment is different from those of First to Third Embodiments in that a plurality of semiconductor chips 120 are included. Description of the structures which are the same as those of First to Third Embodiments is omitted.

As shown in FIG. 2, the semiconductor package of the present embodiment has two semiconductor chips 120. Note that the number of the semiconductor chips 120 is not limited to two, and three or more semiconductor chips 120 may be included. The semiconductor package further possesses the first insulating film 130 and the first wirings 152, 154, and 156 provided over the second terminals 124 and 126 of the semiconductor chips 120. The two semiconductor chips 120 are electrically connected to each other with the first wiring 154.

The second wiring 170 are arranged under the two semiconductor chips 120, respectively, with the bonding film 110 having the second vias 160 interposed therebetween. Furthermore, the resist layer 180 is formed to cover the edge portions of the first wirings 152, 154, and 156 and the second wiring 170. Note that it is not necessary for the semiconductor package to have the resist layer 180 on both surfaces, and the semiconductor package may have the resist layer 180 only under the bottom surface.

The first wirings 152, 154, and 156 and the second wiring 170 are formed with the same method. For example, they are formed by using an electroplating method or a metal paste. Hence, the process can be simplified and a semiconductor package including a plurality of semiconductor chips can be manufactured at low cost. Moreover, it is possible to provide bonding having a higher thermal reliability. In the semiconductor package of the present embodiment, the first wirings 152, 154, and 156 function as electrodes exposed at the top chip surface, whereas the second wiring 170 function as electrodes exposed at the bottom chip surface. Thus, a high-density chip-mounted substrate in which semiconductor packages are stacked can be manufactured.

Fifth Embodiment

In the present embodiment, as a manufacturing method of a semiconductor package according to an embodiment of the present invention, a manufacturing method of the semiconductor package shown in FIG. 1A is explained using FIG. 3A to FIG. 3E, FIG. 4A to FIG. 4D, and FIG. 5.

The semiconductor chip 120 is bonded over the first substrate 100 by using the bonding film 110. As the first substrate 100, a substrate formed by a metal, glass, ceramics, a resin, and the like can be used. A substrate in which glass fiber and the like is mixed in a resin such as an epoxy-based resin may be employed. Alternatively, a printed circuit board over which wiring is formed in advance may be used. Alternatively, a substrate having a surface over which a film in which a thin insulating film is sandwiched between thin films of a metal such as copper is arranged can be used.

The bonding film 110 may have a function to adhere the first substrate 100 and the semiconductor chip 120 to each other. Therefore, an insulating material represented by an organic material such as an epoxy resin, a polyimide, and a polysiloxane can be used. As an insulating material, an insulating DAF can be used, for example. However, as described below, it is preferred to use the bonding film 110 which allows the first substrate 100 to be peeled physically or chemically because the first substrate 100 is peeled off in the process. For example, an adhesive which has a reduced adhesion due to light-irradiation may be used as the bonding film 110.

Figure 3A:
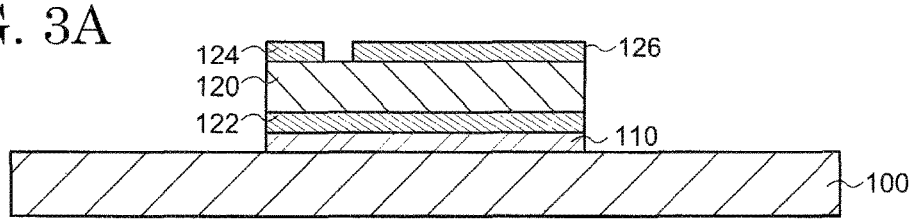
FIG. 3A to FIG. 3E are each a drawing for explaining a manufacturing method of a semiconductor package of an embodiment of the present invention.

The semiconductor chip 120 may be a device utilizing a semiconductor property intrinsic in a semiconductor such as silicon, gallium, silicon carbide, and gallium nitride. For example, a rectifier diode and a transistor are represented, and a power semiconductor device driven at a large voltage and a large current, such as a power transistor and a thyristor, can be employed. A terminal (extraction terminal) is formed on at least one of both chip surfaces of the semiconductor chip 120. In FIG. 3A, an example is illustrated in which the first terminal 122 and two second terminals 124 and 126 are provided.

Figure 3B:
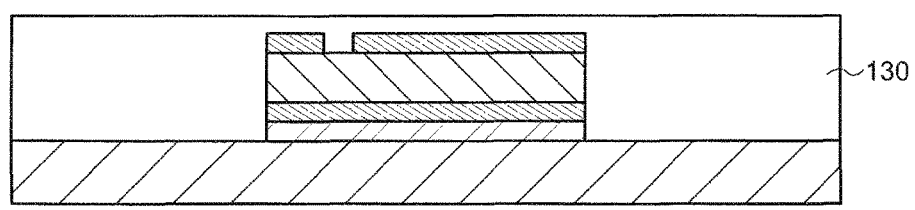

The first insulating film 130 is formed so as to embed the semiconductor chip 120 and the second terminals 124 and 126 (FIG. 3B). The first insulating film 130 can be formed by using an epoxy-based resin or a polyimide-based resin with a wet-type film-forming method such as an ink-jet method, a printing method, a spin-coating method, and a dip-coating method. Alternatively, the first insulating film 130 may be formed by arranging an insulating film over the semiconductor chip 120 and then heating and pressing the insulating film with a lamination processing. A material of the first insulating film 130 may be different from a material of the bonding film 110. That is, a material including in the first insulating film 130 may be different from a material included in the bonding film 110. Therefore, a material surrounding the first vias 142 and 144 may be different from a material surrounding the second via 160.

Figure 3C:
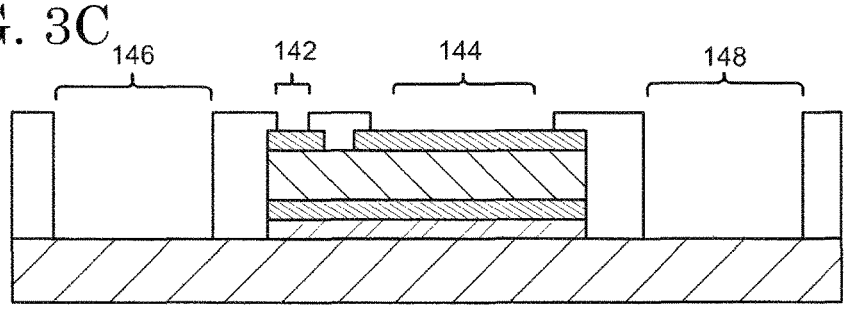

After that, as shown in FIG. 3C, the first vias 142 and 144 are formed in a region of the first insulating film 130, which overlaps with the second vias 124 and 126, to expose the second terminals 124 and 126. Simultaneously, the third vias 146 and 148 which reach the first substrate 100 are formed in the first insulating film 130. The third vias 146 and 148 may be formed so as to be larger than the first vias 142 and 144, by which a large current can be supplied to the semiconductor chip 120. The first vias 142 and 144 and the third vias 146 and 148 may be formed by photolithography or laser irradiation.

Figure 3D:
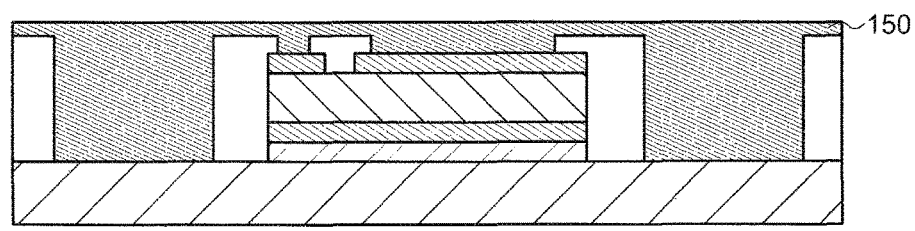
Figure 3E:
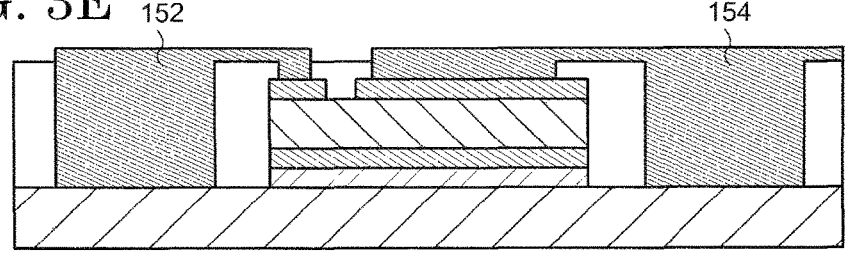

Next, a first wiring layer 150 is formed so as to fill the first vias 142 and 144 and the third vias 146 and 148 (FIG. 3D). The first wiring layer 150 can be formed with an electroplating method or a metal paste. The first wiring layer 150 can include copper or gold. The first wiring layer 150 is then subjected to etching processing to remove unnecessary portions to give the first wiring 152 and 154. The first wiring 152 fills the first via 142 and the third via 146 and is electrically connected to the semiconductor chip 120 through the second terminal 124. On the other hand, the first wiring 154 fills the first via 144 and the third via 148 and is electrically connected to the semiconductor chip 120 through the second terminal 126. The first wirings 152 and 154 are not directly connected to and are separated from each other. Note that the first wirings 152 and 154 are formed by processing the first wiring layer 150, and therefore, these wirings exist in the same layer.

When the first wiring layer 150 is formed with an electroplating method, the first vias 142 and 144 and the third vias 146 and 148 may not be sufficiently filled with a metal. In this case, a metal paste may be used as an auxiliary material. For example, prior to the formation of the first wiring layer 150, a metal paste may be applied in a part of the first vias 142 and 148 or a part of the third vias 146 and 148 to form a metal layer, and then the first wiring layer 150 may be formed with an electroplating method. Alternatively, after the formation of the first wiring layer 150, a metal layer may be additionally formed with a metal paste.

Figure 4A:
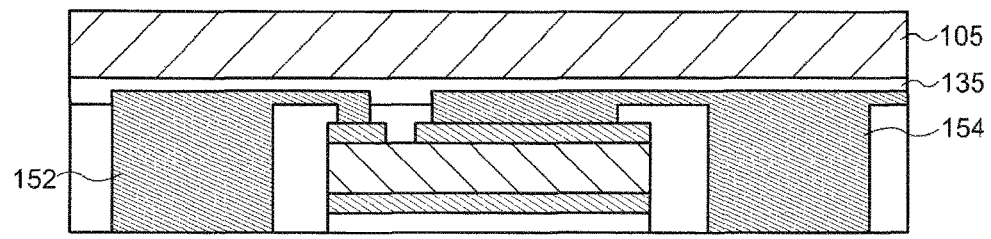
FIG. 4A to FIG. 4D are each a drawing for explaining a manufacturing method of a semiconductor package of an embodiment of the present invention.

Next, the first substrate 100 is peeled off (FIG. 4A). The peeling can be conducted by adding physical force or performing chemical treatment. Therefore, the first substrate 100 functions as a provisional substrate. After peeling, the surface which has been in contact with the first substrate 100 may be washed with an etching developer if necessary.

After that, the second substrate 105 is formed over the first wirings 152 and 154 with the second insulating film 135 interposed therebetween. As the second substrate 105, a substrate which is the same as or similar to the first substrate 100 can be used. As the second substrate 105, the first substrate 100 which has been peeled can be directly reused, or another substrate is newly used. As the second insulating film 135, a material which is the same as that of the first insulating film 130 can be used.

Figure 4B:
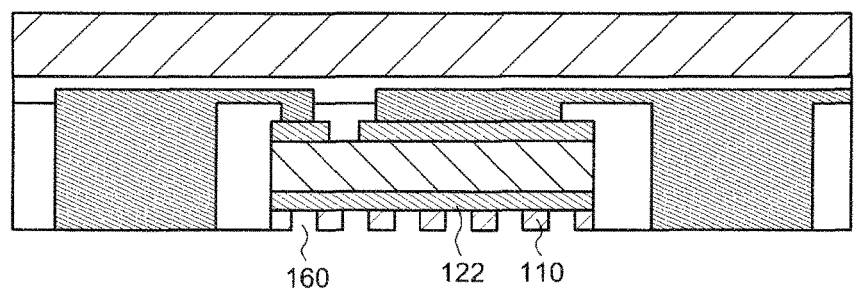

Next, the second vias 160 are formed by conducting laser irradiation or photolithography on the bonding film 110 to expose the first terminal 122 (FIG. 4B). Here, a plurality of second vias 160 is formed, and they are illustrated so that their size is smaller than the size of the first vias 142 and 146. However, a single number of second via 160 may be formed, and its size may be larger than that of the first vias 142 and 146.

Figure 4C:
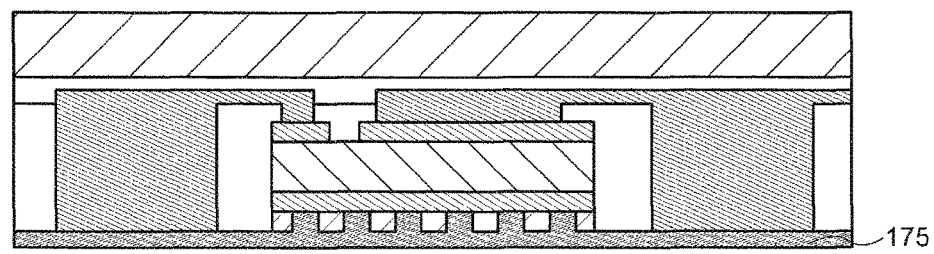
Figure 4D:
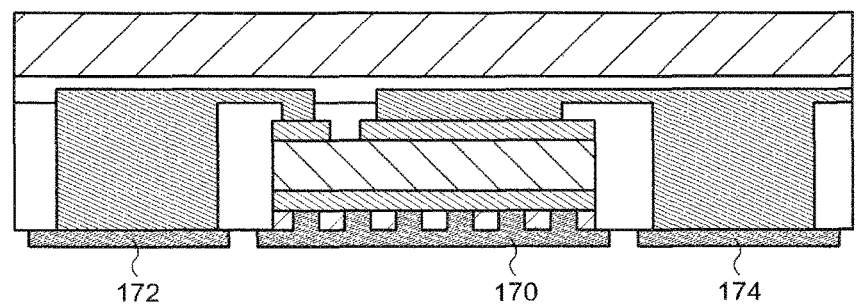
Figure 5:
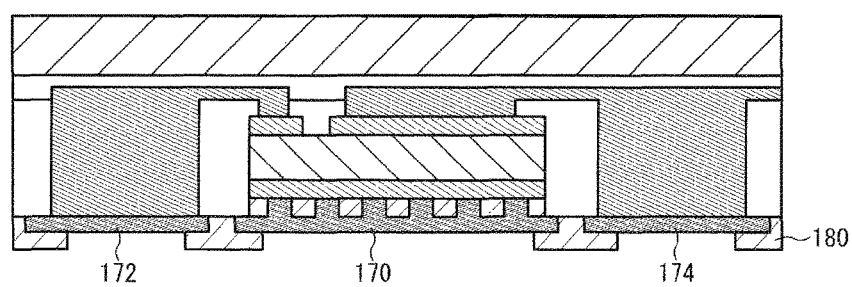
FIG. 5 is a drawing for explaining a manufacturing method of a semiconductor package of an embodiment of the present invention.

Next, a second wiring layer 175 is formed with an electroplating method or a metal paste (FIG. 4C). The second wiring layer 175 is formed so as to fill the second vias 160 and be in contact with the first terminal 122. The formed second wiring layer 175 is subjected to etching processing to remove unnecessary portions to form the second wiring 170 and the third wiring 172 and 174 (FIG. 4D). The second wiring 170 and the third wiring 172 and 174 are separated from one another. The second wiring 170 is electrically connected to the first terminal 122, the third wiring 172 is electrically connected to the first wiring 152, and the third wiring 174 is electrically connected to the first wiring 154. Each of the second wiring 170 and the third wirings 172 and 174 is formed by processing the second wiring layer 175. Hence, these wirings exist in the same layer.

Similar to the formation of the first wiring layer 150, prior to the formation of the second wiring layer 175, a metal paste may be applied in a part of the second vias 160 to form a metal layer, and then the second wiring layer 175 may be formed with an electroplating method. Alternatively, after the formation of the second wiring layer 175 with an electroplating method, a metal layer may be additionally formed with a metal paste.

After that, the resist layer 180 may be formed between the second wiring 170 and the third wiring 172 and between the second wiring 170 and the third wiring 174. The resist layer 180 has a function to protect the edge portions of the second wiring 170 and the third wirings 172 and 174 and can be formed, for example, with a resin by utilizing a wet-type film-formation method. Furthermore, when solder is selectively arranged over the second wiring 170 and the third wirings 172 and 174, a material with low affinity to solder, such as a solder mask, may be used for the resist layer 180. After that, the second substrate 105 may be peeled off or may be left unpeeled. When a metal plate is used as the second substrate 105, the second substrate 105 may be left unpeeled, which allows the second substrate 105 to function as a heat sink.

As described above, in the manufacturing process of the semiconductor package according to an embodiment of the present invention, wiring can be formed over terminals on both chip surfaces with the same manufacturing apparatus in the same process because the wiring can be constructed on the terminals of both chip surfaces by using the same method (e.g., an electroplating method). Hence, the manufacturing process can be simplified and the manufacturing cost can be reduced. Moreover, as the wiring can be formed with a material (e.g., copper) which is the same as that of the terminals on both chip surfaces, bonding with high thermal reliability can be realized.

Sixth Embodiment

In the present embodiment, a manufacturing method of a semiconductor package according to an embodiment of the present invention is explained. Specifically, an example in which a substrate mounted with a wiring thereover is employed as the first substrate shown in Fifth Embodiment is explained by using FIG. 6A to FIG. 6D, FIG. 7A to FIG. 7D, FIG. 8A, and FIG. 8B. Description of the structures which are the same as those of Fifth Embodiment is omitted.

Figure 6A:
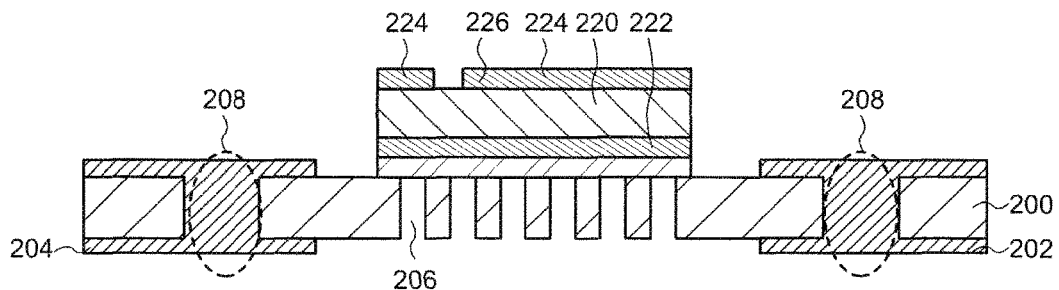
FIG. 6A to FIG. 6D are each a drawing for explaining a manufacturing method of a semiconductor package of an embodiment of the present invention.

In the present embodiment, a substrate (e.g., printed wiring substrate) over which wirings (substrate wiring) 202 and 204 are formed in advance is used as the first substrate 200 (FIG. 6A). Through vias 208 are formed in the first substrate 200, and the substrate wiring 202 and 204 passing through the through vias 208 are disposed. Furthermore, through holes 206 are formed between the two through vias 208. The number of the through holes 206 may be at least one, and a plurality of through holes 206 may be provided.

Figure 6B:
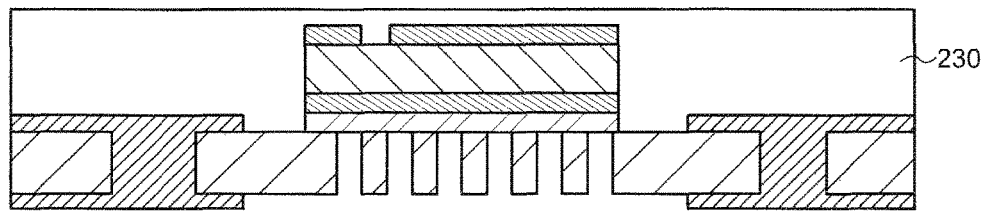
Figure 6C:
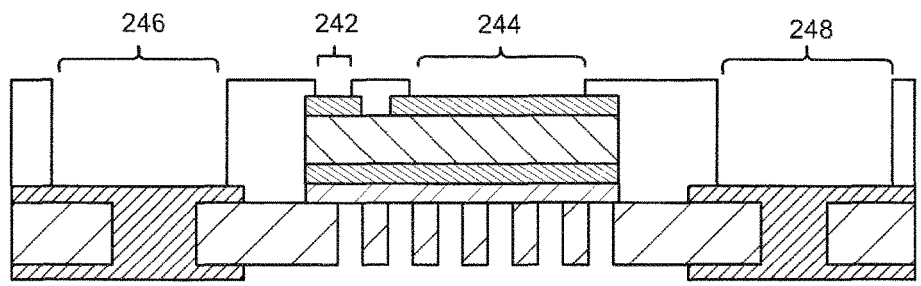

A semiconductor chip 220 provided with a first terminal 222 and second terminals 224 and 226 is bonded through a bonding film 210. At this time, the semiconductor chip 220 is bonded so as to overlap with the through holes 206 (FIG. 6A). Next, a first insulating film 230 is formed so as to embed the semiconductor chip 220 and the second terminals 224 and 226 (FIG. 6B). The fixing method of the semiconductor chip 220 and the formation method of the first insulating film 230 are the same as those of Fifth Embodiment.

Figure 6D:
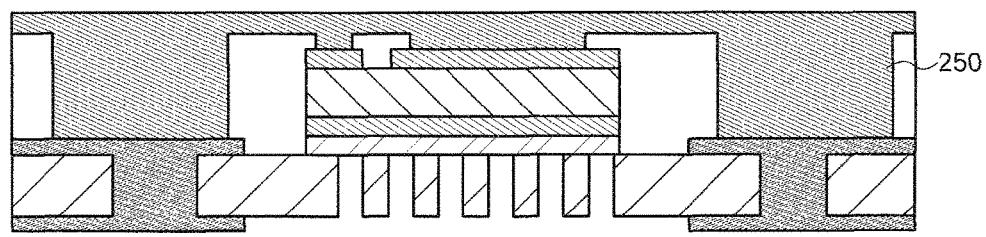
Figure 7A:
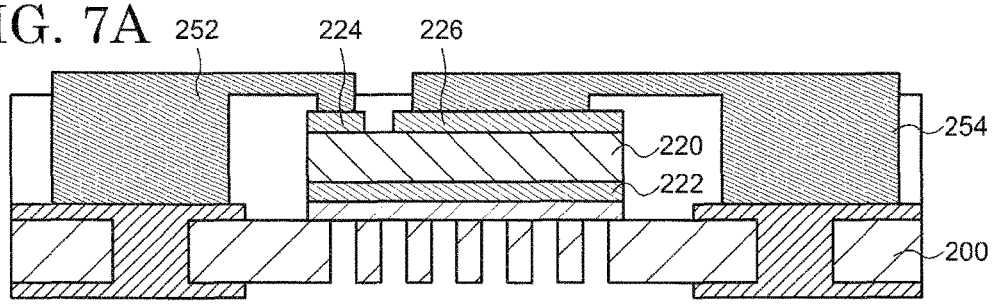
FIG. 7A to FIG. 7D are each a drawing for explaining a manufacturing method of a semiconductor package of an embodiment of the present invention.

Similar to Fifth Embodiment, first vias 242 and 244 and third vias 246 and 248 are formed in the first insulating film 230. After that, a first wiring layer 250 is formed over the first insulating film 230 with an electroplating method or a metal paste so that the first vias 242 and 244 and the third vias 246 and 248 are filled (FIG. 6D). Additionally, the first wiring layer 250 is subjected to etching processing to form first wirings 252 and 254 (FIG. 7A). Therefore, the first wirings 252 and 254 are separated from each other but exist in the same layer. The first wiring 252 is electrically connected to the semiconductor chip 220 through the second terminal 224, whereas the first wiring 254 is electrically connected to the semiconductor chip 220 through the second terminal 226.

Figure 7B:
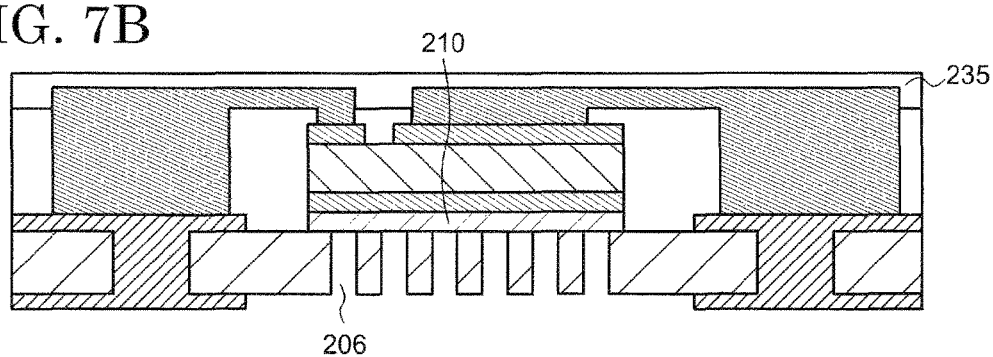

After that, similar to Fifth Embodiment, a second insulating film 235 is formed over the first wirings 252 and 254 (FIG. 7B). Although not shown, a substrate may be additionally formed over the second insulating film 235.

Figure 7C:
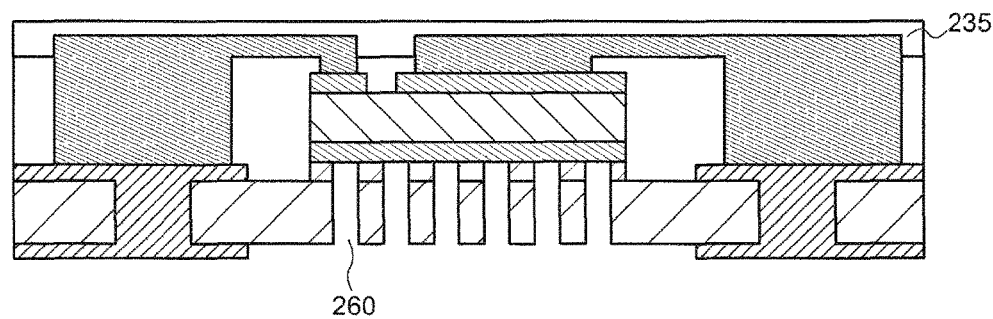

After that, laser irradiation is performed through the through holes 206 to form the second vias 260 and expose the first terminal 222 (FIG. 7C). Here, a plurality of second vias 260 is formed. However, a single second via 260 may be formed.

Figure 7D:
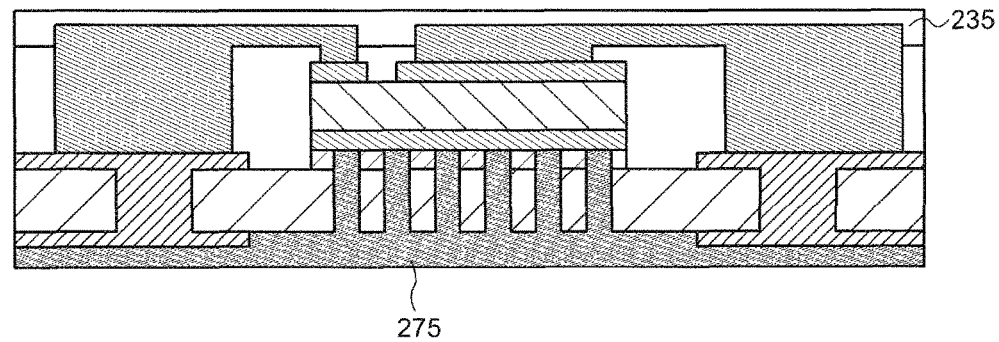
Figure 8A:
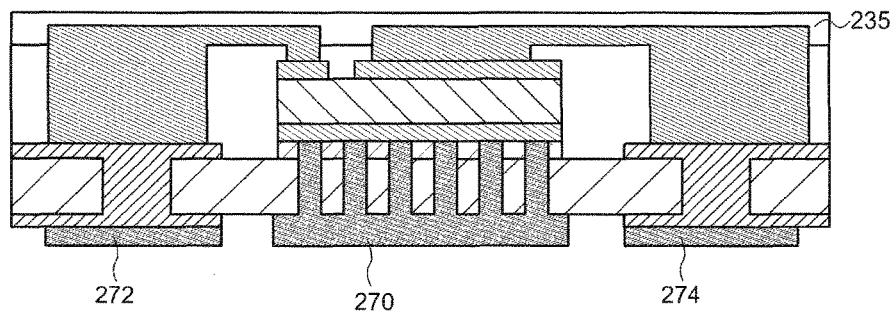
FIG. 8A and FIG. 8B are each a drawing for explaining a manufacturing method of a semiconductor package of an embodiment of the present invention.
Figure 8B:
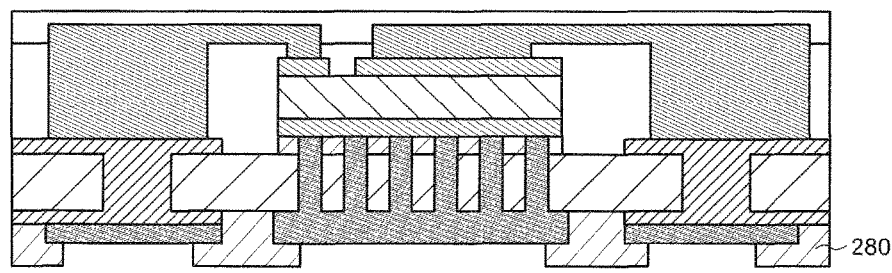

After that, similar to Fifth Embodiment, a second wiring layer 275 is formed with an electroplating method or a metal paste so as to overlap with the substrate wirings 202 and 204 and the first substrate 200 and fill the second vias 260 (FIG. 7D). Furthermore, an etching process is carried out to form a second wiring 270 and third wiring 272 and 274 (FIG. 8A). If necessary, the resist layer 280 may be formed between the second wiring 270 and the third wiring 272 and between the second wiring 270 and the third wiring 274 (FIG. 8B).

As described above, in the manufacturing process of the semiconductor package according to an embodiment of the present invention, wiring can be formed over terminals on both chip surfaces with the same manufacturing apparatus in the same process because the wiring can be constructed on the terminals of both chip surfaces by using the same method (e.g., an electroplating method). Hence, the manufacturing process can be simplified and the manufacturing cost can be reduced. Moreover, as the wiring can be formed with a material (e.g., copper) which is the same as that of the terminals on both chip surfaces, bonding with high thermal reliability can be realized. Additionally, it is not necessary for the first substrate 200 to be peeled off, and it is not necessary for the second substrate 105 to be formed over the first wiring 252 and 254. Thus, the process can be shortened. Furthermore, the substrate wirings 202 and 204 can be freely designed in advance and a substrate suitable for the application of a large current can be employed.

What is clamed is:

1. A semiconductor package comprising:
   a semiconductor chip;
   a first insulating film embedding the semiconductor chip and having a first via;
   a first wiring over the semiconductor chip, the first wiring being electrically connected to the semiconductor chip through the first via;
   a bonding film under the semiconductor chip, the bonding film having a second via; and
   a second wiring under the bonding film, the second wiring being electrically connected to the semiconductor chip through the second via,
   wherein a material included in the first insulating film is different from a material included in the bonding film.

2. The semiconductor package according to claim 1, wherein the semiconductor chip comprises a first terminal and a second terminal under and over the semiconductor chip, respectively, and
   wherein the semiconductor chip is electrically connected to the second wiring and the first wiring through the first terminal and the second terminal, respectively.

3. The semiconductor package according to claim 1, further comprising:
   a third via in the first insulating film; and
   a third wiring under the first insulating film, the third wiring being electrically connected to the first wiring through the third via.

4. The semiconductor package according to claim 3, wherein the second wiring and the third wiring exist in the same layer.

5. The semiconductor package according to claim 3, wherein the first via, the second via, and the third via are different in size from one another.

6. The semiconductor package according to claim 1, wherein the bonding film further comprises a plurality of vias.

7. The semiconductor package according to claim 3, wherein the first wiring and the third wiring are connected to each other in the third via.

8. The semiconductor package according to claim 1, wherein the bonding film includes an insulating material.

9. The semiconductor package according to claim 1, further comprising a substrate over the first wiring.

10. A manufacturing method of a semiconductor package, the manufacturing method comprising:
   bonding a semiconductor chip to a first substrate with a bonding film interposed therebetween;
   forming a first insulating film over the semiconductor chip;
   forming a first via in the first insulating film;
   forming a first wiring over the first insulating film so as to be electrically connected to the semiconductor chip through the first via;
   forming a second via in the bonding film; and
   forming a second wiring under the semiconductor chip so as to be electrically connected to the semiconductor chip through the second via.

11. The manufacturing method according to claim 10, wherein the semiconductor chip comprises a first terminal and a second terminal under and over the semiconductor chip, respectively, and
   wherein the first wiring and the second wiring are formed so as to be electrically connected to the semiconductor chip through the second terminal and the first terminal, respectively.

12. The manufacturing method according to claim 10, further comprising:
   forming a third via in the first insulating film simultaneously with the first via,
   wherein the first wiring is formed so as to fill the third via.

13. The manufacturing method according to claim 12, further comprising:
   forming a third wiring under the third via simultaneously with the second wiring so that the third wiring is electrically connected to the first wiring.

14. The manufacturing method according to claim 12, wherein the first via, the second via, and the third via are different in size from one another.

15. The manufacturing method according to claim 10, wherein the second via is formed so that the bonding film comprises a plurality of vias.

16. The manufacturing method according to claim 10, wherein the bonding film includes an insulating material.

17. The manufacturing method according to claim 10, wherein a material included in the first insulating film is different from a material included in the bonding film.

18. The manufacturing method according to claim 12, wherein the first substrate comprises an opening portion and a wiring passing through the opening portion, and
   wherein the first wiring is formed so as to be electrically connected to the wiring through the third via.

* * * * *